(12) United States Patent
Parikh et al.

(10) Patent No.: US 8,394,681 B2
(45) Date of Patent: Mar. 12, 2013

(54) TRANSISTOR LAYOUT FOR MANUFACTURING PROCESS CONTROL

(75) Inventors: Ashesh Parikh, Frisco, TX (US); Anand Seshadri, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 6 days.

(21) Appl. No.: 12/850,813

(22) Filed: Aug. 5, 2010

(65) Prior Publication Data
US 2010/0297815 A1 Nov. 25, 2010

Related U.S. Application Data

(62) Division of application No. 12/462,867, filed on Aug. 11, 2009, now Pat. No. 7,985,990.

(60) Provisional application No. 61/088,163, filed on Aug. 12, 2008.

(51) Int. Cl.
*H01L 21/8234* (2006.01)

(52) U.S. Cl. . 438/129; 438/199; 257/255; 257/E21.602; 257/E21.661; 257/E29.004

(58) Field of Classification Search .................. 257/255, 257/E21.602, E21.661, E29.004, E27.099
See application file for complete search history.

(56) References Cited

U.S. PATENT DOCUMENTS

| 7,102,166 | B1 | 9/2006 | Bryant et al. | |
|---|---|---|---|---|
| 7,170,775 | B2 * | 1/2007 | Lin et al. | 365/158 |
| 2001/0033001 | A1 * | 10/2001 | Kato | 257/347 |
| 2002/0104988 | A1 * | 8/2002 | Shibata et al. | 257/11 |
| 2007/0091672 | A1 * | 4/2007 | Lin et al. | 365/158 |
| 2010/0270557 | A1 * | 10/2010 | Im | 257/66 |

OTHER PUBLICATIONS

Sayama et al., "Effect of <100> Channel Direction for High Performance SCE Immune pMOSFET with Less Than 0.15 μm Gate Length", IEDM 99-657 27.5.1 (1999).
2005 IMEC Channel Engineering Report (http://www.imec.be/ww-winter/mediacenter/en/SR2005/html/142274.html).

* cited by examiner

*Primary Examiner* — Mamadou Diallo
(74) *Attorney, Agent, or Firm* — Rose Alyssa Keagy; Wade J. Brady, III; Frederick J. Telecky, Jr.

(57) ABSTRACT

A symmetrical circuit is disclosed (FIG. 4). The circuit includes a first transistor (220) having a first channel in a substantial shape of a parallelogram (FIG. 5A) with acute angles. The first transistor has a first current path (506) oriented in a first crystal direction (520). A first control gate (362) overlies the first channel. A second transistor (222) is connected to the first transistor and has a second channel in the substantial shape of a parallelogram with acute angles. The second transistor has a second current path (502) oriented parallel to the first current path. A second control gate (360) overlies the second channel.

4 Claims, 5 Drawing Sheets

TRANSISTOR LAYOUT FOR MANUFACTURING PROCESS CONTROL

CROSS-REFERENCE TO RELATED APPLICATIONS

This application is a divisional of and incorporates by reference application Ser. No. 12/462,867 filed Aug. 11, 2009, which claims the benefit of and incorporates by reference U.S. Provisional Application No. 61/088,163 filed Aug. 12, 2008.

BACKGROUND OF THE INVENTION

Embodiments of the present invention relate to layout of a symmetrical circuit which may be used as a static random access memory (SRAM) cell, a sense amplifier, or other circuit where alignment tolerant balanced operation is important.

Shrinking semiconductor integrated circuit feature sizes have placed increasing challenges on semiconductor integrated circuit processing. In particular, a balance between high packing density and yield require a finely tuned manufacturing process. Second order effects that might have been ignored a decade ago are now critical to cost-effective processing as will be explained in detail.

FIG. 1 is a diagram of a silicon semiconductor wafer of the prior art. The wafer has a uniform lattice structure of face-centered cubic crystals as indicated by circles 104, 106, 108, and 110. A notch 102 or flat indicates the crystal orientation of the wafer as defined by Miller indices. For example, a type <100> orientation includes equivalent directions [100] (116), [010] (112), [001], [-100], and [0-10]. A type <110> orientation includes equivalent directions [110] (114), [011], [101], [-1-10], [0-1-1], [-10-1], [-110], [0-11], [-101], [1-10], [01-1], and [10-1]. In general, crystal orientation may have a significant impact on transistor performance. Sayama et al., *Effect of <100> Channel Direction for High Performance SCE Immune pMOSFET with Less Than 0.15 μm Gate Length*, IEDM 99-657 27.5.1 (1999) discuss the effect of channel orientation on P-channel and N-channel transistors. A 2005 IMEC Channel engineering report (http://www.imec.be/wwwinter/mediacenter/en/SR2005/html/142274.html) agrees with these findings and discloses that N-channel transistors are less orientation dependent than P-channel transistors but may be affected by stress. In addition, Bryant et al. (U.S. Pat. No. 7,102,166, filed Apr. 21, 2005) disclose hybrid orientation of field effect transistors to reduce stress.

Referring to FIG. 2, there is a schematic diagram of a six-transistor (6-T) static random access memory (SRAM) cell of the prior art. The same reference numerals are used throughout the drawing figures to indicate common features. The memory cell includes P-channel drive transistors 220 and 222 and N-channel drive transistors 230 and 232 arranged in a cross-coupled configuration. The P-channel drive transistors are connected at power supply terminal Vdd 200. The N-channel drive transistors are connected at reference supply terminal Vss 202. The drain terminals of drive transistors 220 and 230 are connected to true sense terminal 240. Likewise, the drain terminals of drive transistors 222 and 232 are connected to sense terminal 242. Sense terminals 240 and 242 are selectively connected to true bit line 204 (BL) and complementary bit line 206 (/BL), respectively, by access transistors 208 and 210. These access transistors are controlled by signals applied to word line terminal 102 (WL). Crystal orientation and other factors may have a significant impact on 6-T memory cell performance such as static noise margin, trip voltage, disturb read and write, and other parameters as will be discussed in detail.

BRIEF SUMMARY OF THE INVENTION

In a preferred embodiment of the present invention, a symmetrical circuit is disclosed. The circuit includes a first transistor with a channel in a substantial shape of a parallelogram with acute angles. The first transistor has a first current path oriented in a first crystal direction. A control gate overlies the channel. A second transistor is connected to the first transistor and has a channel in the substantial shape of a parallelogram with acute angles. The second transistor has a second current path oriented parallel to the first current path. A second control gate overlies the second channel.

DETAILED DESCRIPTION OF THE INVENTION

The preferred embodiments of the present invention provide significant advantages in misalignment tolerance for a given process as will become evident from the following detailed description.

Figure 2:
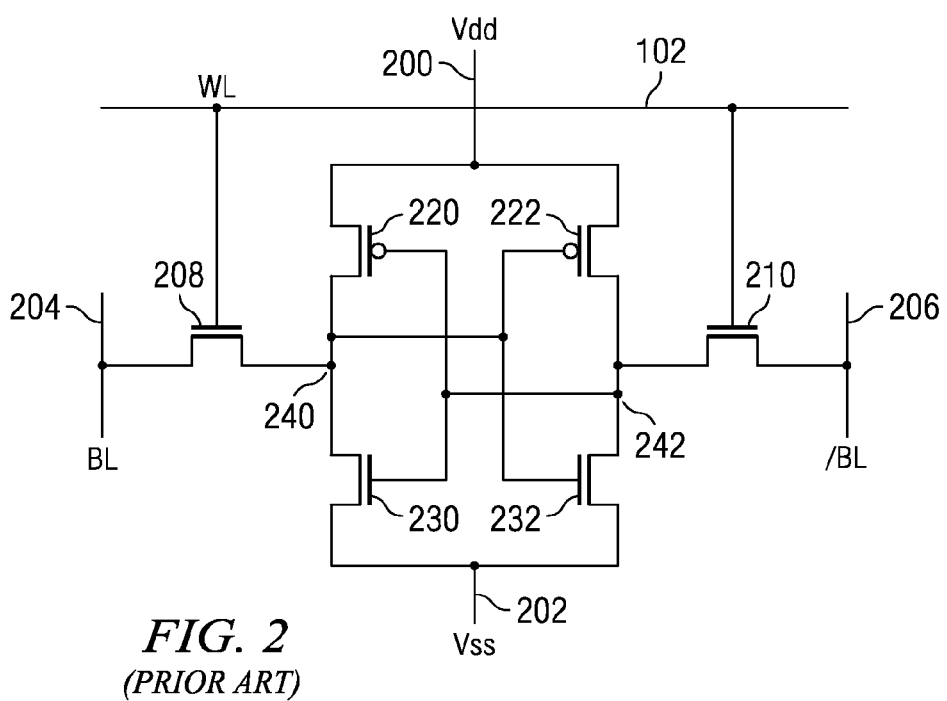
FIG. 2 is a schematic diagram of a six transistor (6-T) static random access memory cell of the prior art.
Figure 3A:
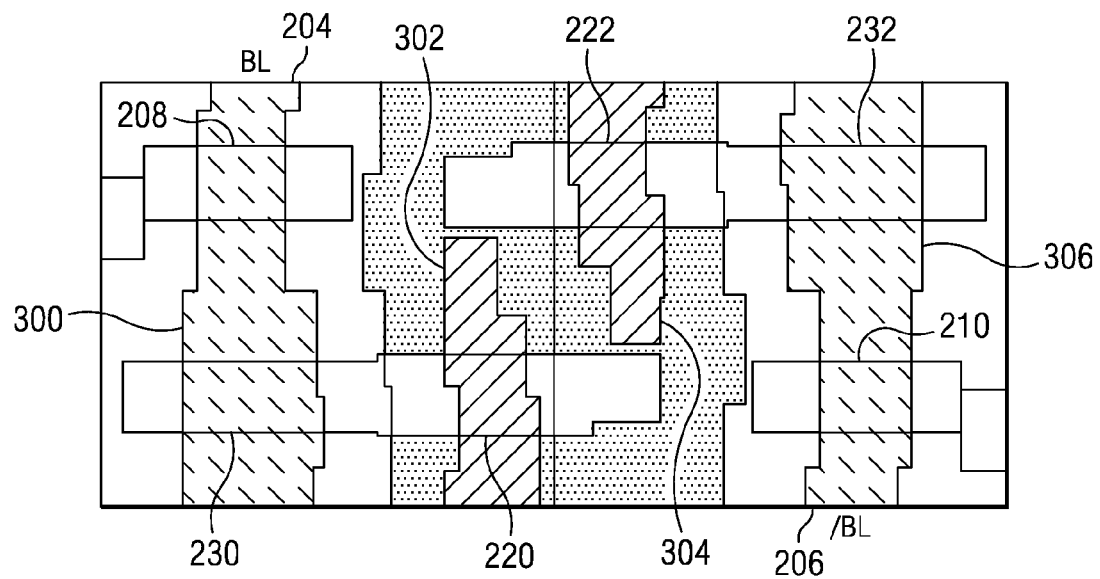
FIG. 3A is a prior art layout of the 6-T memory cell of FIG. 2.
Figure 3B:
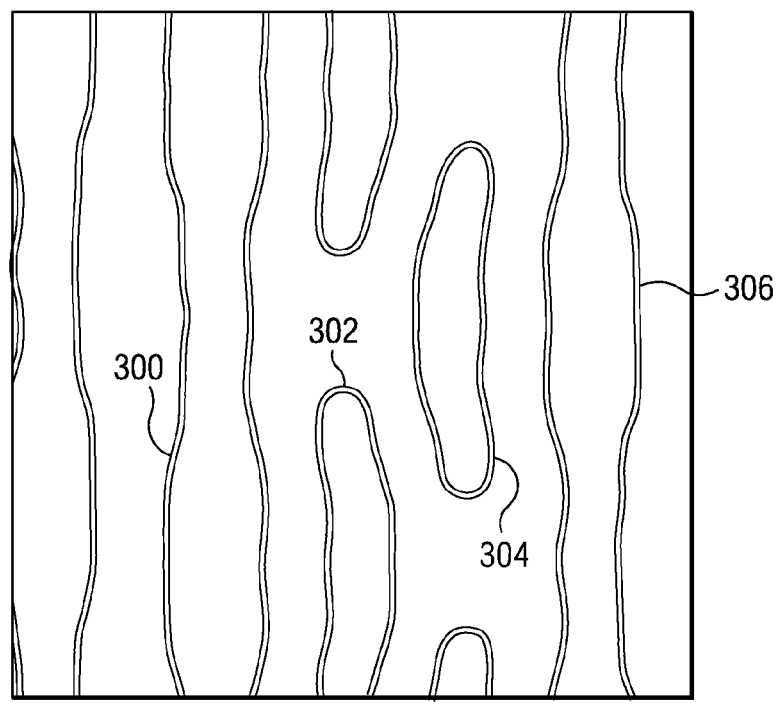
FIG. 3B is a depiction of a photomicrograph of the active area of the layout of FIG. 3A.

The present inventors have determined that SRAM cells using the same process flow may have significantly different performance variation. A primary reason for this anomaly is the imbalance of 6-T memory cell transistors due to misalignment and crystal orientation variation. Referring now to FIG. 3A, there is a prior art layout of the 6-T memory cell of FIG. 2. The same reference numerals are used to indicate corresponding features in the drawing figures. The 6-T memory cell is carefully designed for an optimal balance of packing density and process yield. The layout illustrates active areas 300, 302, 304, and 306 of the 6-T memory cell. These are layout patterns as they appear on a design terminal. Active areas are areas of the substrate that are separated by isolation regions such as shallow trench isolation (STI) or local oxidation of silicon (LOCOS). These are areas where drain, source, and channel regions are formed. Small feature sizes of contemporary integrated circuits, however, lose some of the high spatial frequency components of the circuit pattern. For example, referring to FIG. 3B, there is a depiction of a photomicrograph of active areas 300, 302, 304, and 306 of the 6-T memory cell of FIG. 3A. In particular, the well defined vertical and horizontal edges of the active areas of 302 and 304 in FIG. 3A become "banana" shaped geometries on silicon as in FIG. 3B.

Figure 3C:
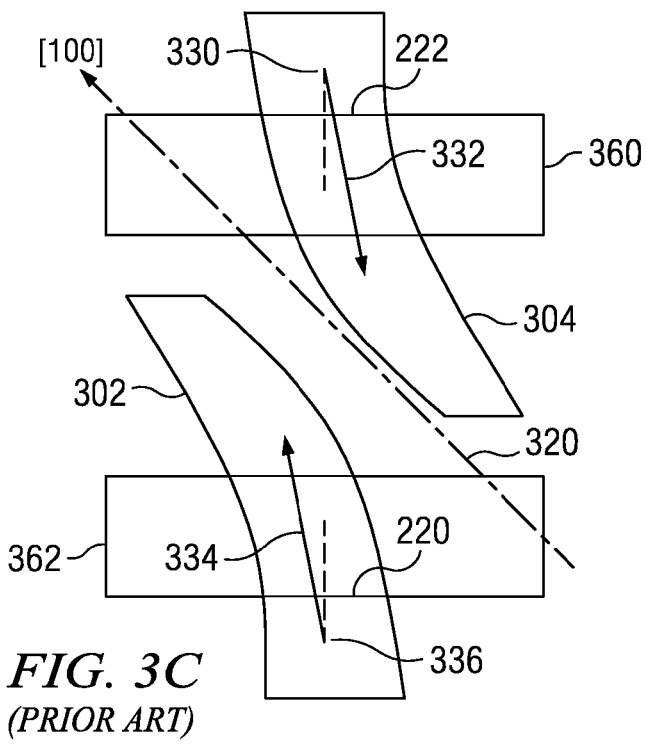
FIG. 3C is a simplified diagram of the P-channel transistors as laid out in FIG. 3A with the polycrystalline silicon gate properly aligned to the active area.

Turning now to FIG. 3C, there is a simplified diagram of the P-channel transistors 220 and 222 as laid out in FIG. 3A with the respective polycrystalline silicon gates 362 and 360 properly aligned to the "banana" shaped active areas 302 and 304. The P-channel transistors 220 and 222 have respective current paths or channel directions 334 and 332. The [100] crystal orientation direction is indicated by dashed arrow 320. These current paths 334 and 332 form respective angles 336 and 330 with respect to the dashed lines that are perpendicular to the polycrystalline silicon gates 362 and 360. With perfect alignment of respective gates and active areas, angles 336 and 330 are equal.

Figure 3D:
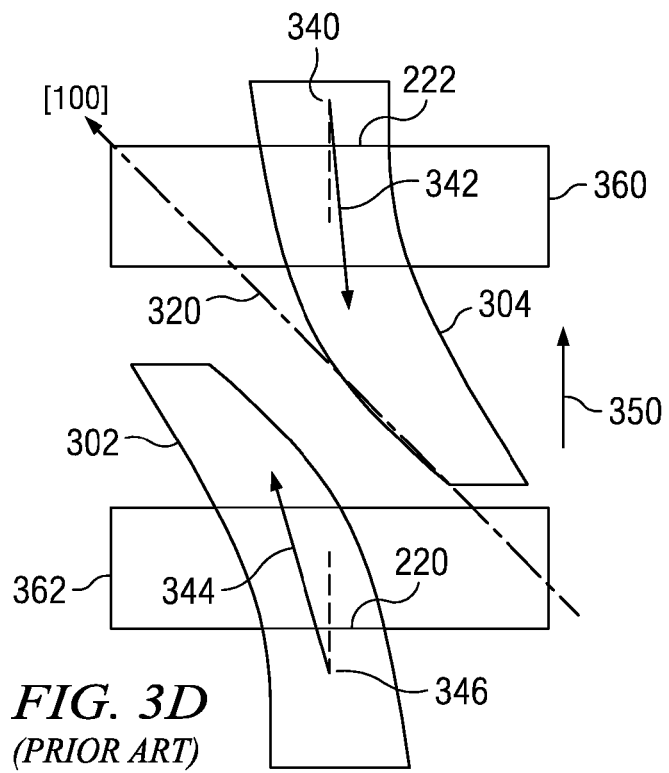
FIG. 3D is a simplified diagram of the P-channel transistors as laid out in FIG. 3A with the polycrystalline silicon gate misaligned with respect to the active area.

By way of comparison, FIG. 3D shows the same features as FIG. 3C. However, the polycrystalline silicon gates 362 and 360 are misaligned with their respective active areas 302 and 304 as shown by arrow 350. There are at least two disadvantageous results of this misalignment. First, polycrystalline silicon gate 362 is shifted to a more narrow part of "banana" shaped active area 302, whereas polycrystalline silicon gate 360 is shifted to a wider part of "banana" shaped active area 304. The effective width of P-channel transistor 220 decreases while the effective width of P-channel transistor 222 increases. Furthermore, due to the curvature of the "banana" shaped active areas, the direction of each current path changes with respect to crystal orientation 320. The channel direction of P-channel transistor 220 is indicated by arrow 344. The channel direction of P-channel transistor 222 is indicated by arrow 342. These current paths 344 and 342 form respective angles 346 and 340 with respect to the dashed lines that are perpendicular to the polycrystalline silicon gates 362 and 360. Angle 346 increases, therefore, but angle 340 decreases. Both the effective channel width and the difference in crystal orientation with respect to the misaligned channels create an imbalance between the P-channel transistors 220 and 222. This imbalance creates significant asymmetry between adjacent memory cells that are mirror images of their nearest neighbors. As a result, memory cell parameter measurements such as static noise margin, trip voltage, disturb read and write, and other parameters as will have a large standard deviation within a memory array.

Figure 4:
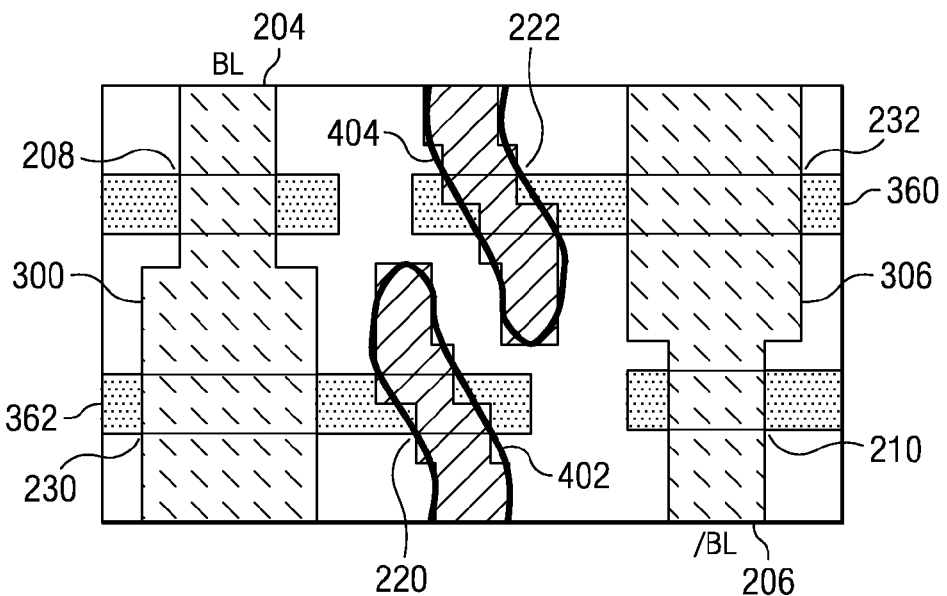
FIG. 4 is a layout of a 6-T static random access memory cell of the present invention.

Referring now to FIG. 4, there is a layout of a 6-T static random access memory cell of the present invention. The same reference numerals are used to indicate the same elements as previously described. Active areas 402 and 404 are now designed in a stair step manner at approximately a 45 degree angle with respect to the polycrystalline silicon gates 362 and 360, respectively. The active areas 402 and 404 form patterns on the silicon substrate as indicated by the bold lines due to a loss of some of the high spatial frequency components of the circuit pattern. The channel areas of P-channel transistors 220 and 222 are substantially parallelograms having acute and obtuse angles with respect to the polycrystalline silicon gates 362 and 360. The term "substantially parallelograms" means that the edges of the channel active areas may not be exactly straight and may retain a somewhat wavy appearance from the stair step design. Also, corners of the channel area may not be sharp and well defined angles for the same reason. The general shape of each of the channel active areas, however, is that of a parallelogram having acute and obtuse angles. The measure of the acute and obtuse angles may vary with different designs. The inventors have determined that acute angles between 40 and 50 degrees and corresponding obtuse angles between 140 and 130 degrees provide a good balance between packing density and yield.

Figure 5A:
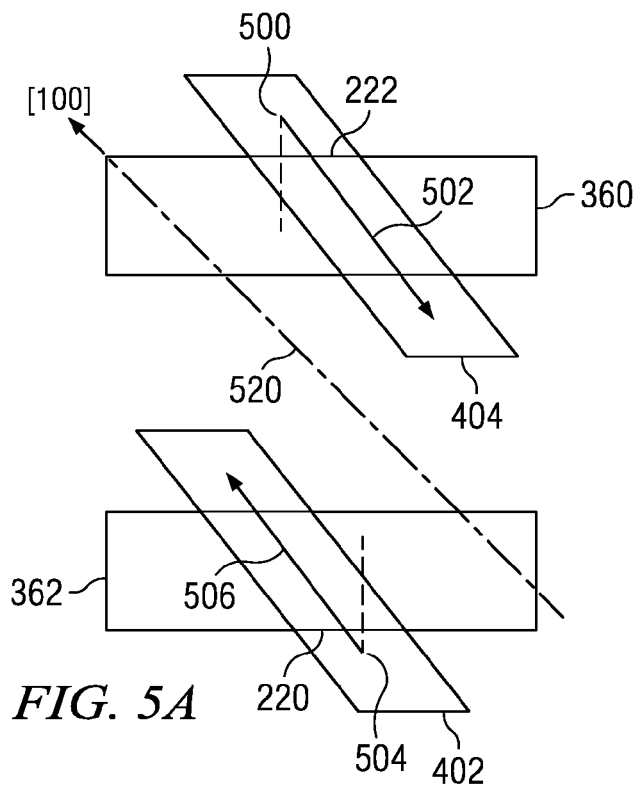
FIG. 5A is a simplified diagram of the P-channel transistors as laid out in FIG. 4 with the polycrystalline silicon gate properly aligned to the active area.

Turning now to FIG. 5A, there is a simplified diagram of the P-channel transistors 220 and 222 as laid out in FIG. 4 with the respective polycrystalline silicon gates 362 and 360 properly aligned to the active areas 402 and 404. The P-channel transistors 220 and 222 have respective current paths or channel directions 506 and 502. The crystal orientation direction is indicated by dashed arrow 520. These current paths 506 and 502 form respective angles 504 and 500 with respect to the dashed lines that are perpendicular to the polycrystalline silicon gates 362 and 360. With perfect alignment of respective gates and active areas, angles 504 and 500 are equal. Moreover, since the current paths 506 and 502 are approximately parallel to the [100] crystal orientation direction 520, the P-channel transistors 220 and 222 have a 15% increase in drain current with respect to identical transistors having current paths parallel to the [110] crystal orientation direction. The effective width of P-channel transistors 220 and 222, therefore, may be advantageously reduced by 15% with respect to such identical transistors having current paths parallel to the crystal orientation direction.

Figure 5B:
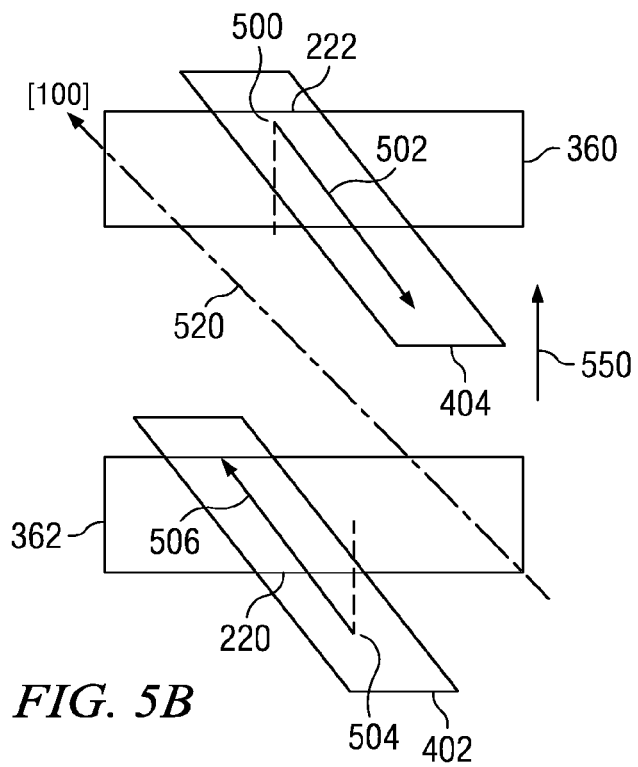
FIG. 5B is a simplified diagram of the P-channel transistors as laid out in FIG. 4 with the polycrystalline silicon gate misaligned with respect to the active area.

By way of comparison, FIG. 5B shows the same features as FIG. 5A. However, the polycrystalline silicon gates 362 and 360 are misaligned with their respective active areas 402 and 404 as shown by arrow 550. There are at least two advantageous results of this design. As parallelograms, the shape of each channel active area remains unchanged. Thus, the effective width of both P-channel transistors 220 and 222 remains equal and unchanged. Furthermore, due to parallelogram shape of the channel regions, the direction of each current path 506 and 502 is unchanged and approximately parallel to the [100] crystal orientation direction 520. Angles 504 and 500 remain equal, so there is no imbalance between P-channel transistors 220 and 222 due to crystal orientation. As a result, memory cell parameter measurements such as static noise margin, trip voltage, disturb read and write, and other parameters as will advantageously have a much smaller standard deviation than memory cells of the prior art.

Figure 1:
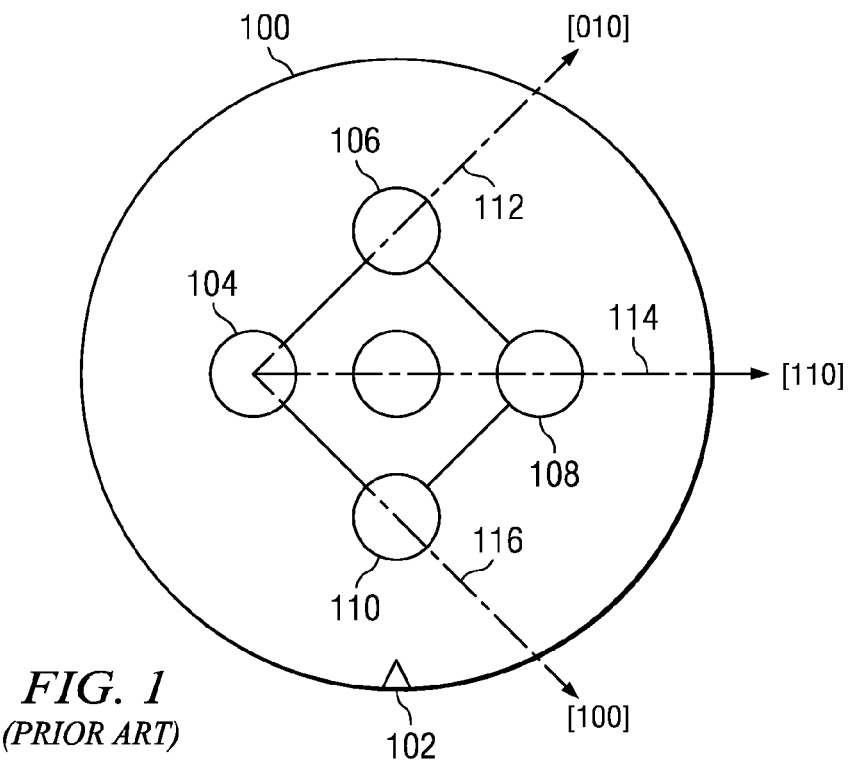
FIG. 1 is a diagram of a semiconductor wafer of the prior art.
Figure 6:
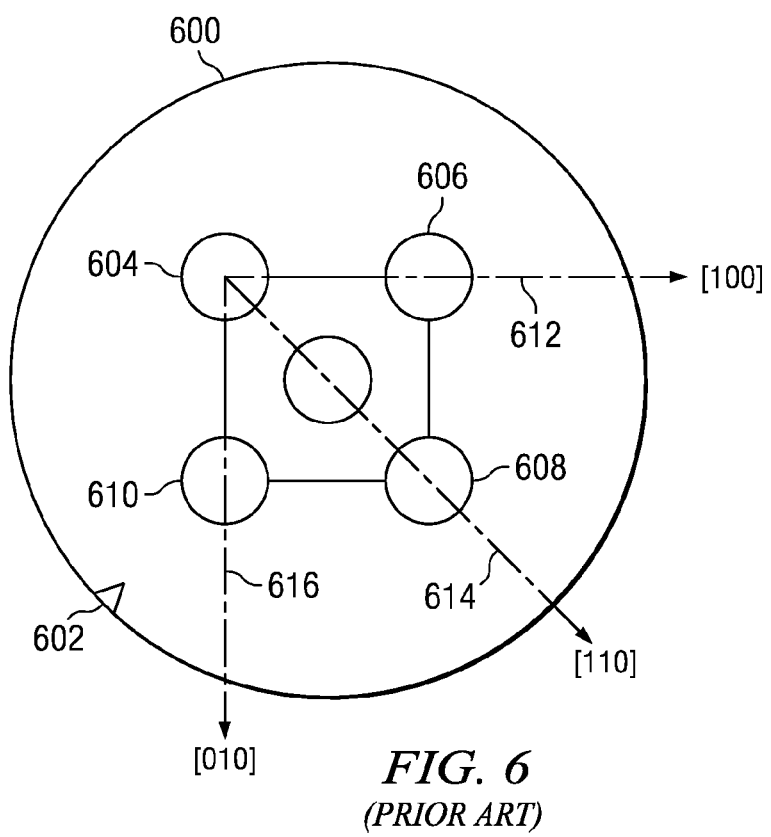
FIG. 6 is a diagram of a semiconductor wafer of the prior art having a different orientation than the semiconductor wafer of FIG. 1.

Still further, while numerous examples have thus been provided, one skilled in the art should recognize that various modifications, substitutions, or alterations may be made to the described embodiments while still falling with the inventive scope as defined by the following claims. For example, N-channel transistor performance may also be affected by crystal orientation and stress. Furthermore, referring to FIG. 6 there is a diagram of a semiconductor wafer 600 of the prior art having a different crystal orientation than the semiconductor wafer of FIG. 1. The wafer has a uniform lattice structure of face-centered cubic crystals as indicated by circles 604, 606, 608, and 610. The alignment notch 602, however, is rotated 45 degrees with respect to the wafer of FIG. 1. The [100] crystal direction 612, therefore, is horizontal. The [010] crystal direction 616 is vertical, and the crystal direction 614 bisects the [100] and [010] directions. When the memory cell of FIG. 4 is formed on a semiconductor wafer with this different crystal orientation, the current paths of P-channel transistors 220 and 222 are no longer parallel to the [100] crystal direction. For the crystal orientation of FIG. 6, the current paths will have directions between the [100] and [110] crystal directions. Current of both P-channel transistors 220 and 222 will, therefore, be slightly less than identical transistors having current paths parallel to the [100] direction. The main advantages of the present invention are substantially the same. Physical dimensions and crystal orientation of P-channel transistors 220 and 222 will remain equal with normal misalignment. The inventors have determined that parallelogram shaped transistor channels having acute angles between 70 and 90 degrees and corresponding obtuse angles between 110 and 90 degrees provide a good balance between packing density and yield for this crystal orientation. Other combinations will be readily apparent to one of ordinary skill in the art having access to the instant specification.

What is claimed is:

1. A method of forming a circuit, comprising the steps of:
    forming a first transistor in a silicon semiconductor wafer having a uniform lattice structure of face-centered cubic crystals; the first transistor having a first channel oriented in a first crystal direction and having a substantial shape of a parallelogram with acute angles;
    forming a second transistor having a second channel oriented parallel to the first channel and having the substantial shape of a parallelogram with acute angles; and
    connecting a source of the first transistor to a source the second transistor;
    wherein current paths of the first and second transistors are approximately parallel to the first crystal direction.

2. A method as in claim 1, wherein the first crystal direction is a type <100> crystal direction.

3. A method as in claim 1, comprising the steps of:
    forming a third transistor having a third channel oriented in a second crystal direction and having a substantial shape of a rectangle;
    forming a fourth transistor having a fourth channel oriented parallel to the third channel, and having the substantial shape of a rectangle;
    connecting a source of the third transistor to a source of the fourth transistor;
    connecting a drain of the first transistor to a drain of the third transistor; and
    connecting a drain of the second transistor to a drain of the fourth transistor.

4. A method as in claim 3, wherein the first crystal direction is a type <100> crystal direction, and wherein the second crystal direction is a type <110> crystal direction.

\* \* \* \* \*